(12) United States Patent
Kuo

(10) Patent No.: US 10,971,650 B2
(45) Date of Patent: Apr. 6, 2021

(54) LIGHT EMITTING DEVICE

(71) Applicant: Lextar Electronics Corporation, Hsinchu (TW)

(72) Inventor: Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/524,165

(22) Filed: Jul. 29, 2019

(65) Prior Publication Data

US 2021/0036185 A1 Feb. 4, 2021

(51) Int. Cl.
| | |
|---|---|
| *H01L 33/10* | (2010.01) |
| *H01L 33/06* | (2010.01) |
| *H01L 33/44* | (2010.01) |
| *H01L 33/30* | (2010.01) |
| *H01L 33/22* | (2010.01) |

(52) U.S. Cl.
CPC .............. *H01L 33/10* (2013.01); *H01L 33/06* (2013.01); *H01L 33/22* (2013.01); *H01L 33/30* (2013.01); *H01L 33/44* (2013.01)

(58) Field of Classification Search
CPC ......... H01L 33/10; H01L 33/06; H01L 33/44; H01L 33/30; H01L 33/22
USPC .......................................................... 257/13
See application file for complete search history.

(56) References Cited

U.S. PATENT DOCUMENTS

| | | | |
|---|---|---|---|
| 5,286,335 A | 2/1994 | Drabik et al. | |
| 5,981,976 A | 11/1999 | Murasato | |
| 6,791,119 B2 | 9/2004 | Slater et al. | |
| 6,914,268 B2 | 7/2005 | Shei et al. | |
| 7,199,390 B2 | 4/2007 | Wang et al. | |
| 8,723,158 B2 | 5/2014 | Jang et al. | |
| 8,931,906 B2 | 1/2015 | Huang et al. | |
| 9,112,093 B2 | 8/2015 | Lim et al. | |
| 9,142,741 B2 | 9/2015 | Shatalov et al. | |
| 9,548,423 B2 | 1/2017 | Chien et al. | |
| 9,947,835 B2 | 4/2018 | Seo et al. | |
| 10,116,120 B2 | 10/2018 | Univ et al. | |
| 2002/0145147 A1 | 10/2002 | Chiou et al. | |

(Continued)

FOREIGN PATENT DOCUMENTS

| | | |
|---|---|---|
| TW | 201409754 A | 3/2014 |
| TW | 201836143 A | 10/2018 |
| TW | 201841391 A | 11/2018 |

*Primary Examiner* — Alexander O Williams
(74) *Attorney, Agent, or Firm* — CKC & Partners Co., LLC

(57) ABSTRACT

A light emitting device includes a stacked structure and a first insulating layer covering at least side surfaces of the stacked structure including a p-type and n-type semiconductor layers, a light emitting layer sandwiched between the p-type and n-type semiconductor layers, an n-type electrode on the n-type semiconductor layer, an n-type contact layer sandwiched between the n-type semiconductor layer and the n-type electrode, a p-type electrode on the p-type semiconductor layer, an n-type contact pad on the n-type electrode, a p-type contact pad on the p-type electrode, and a semiconductor reflector between the light emitting layer and the n-type contact layer including multiple periods, each period including at least a first layer and at least a second layer having a refractive index different from a refractive index of the first layer. The light emitting device could be applied to wide color gamut (WCG) backlight modules or ultra-thin backlight modules.

20 Claims, 4 Drawing Sheets

(56) References Cited

U.S. PATENT DOCUMENTS

| | | | |
|---|---|---|---|
| 2004/0211972 A1 | 10/2004 | Du et al. | |
| 2011/0210354 A1 | 9/2011 | Ichikawa et al. | |
| 2015/0140710 A1* | 5/2015 | McLaurin | H01S 5/0217 438/31 |
| 2017/0098735 A1* | 4/2017 | Huang | H01L 33/30 |
| 2017/0250311 A1* | 8/2017 | Lin | H01L 33/06 |
| 2018/0033918 A1* | 2/2018 | Lin | H01L 33/22 |
| 2018/0078782 A1* | 3/2018 | Hsieh | H01L 25/0756 |
| 2018/0204973 A1 | 7/2018 | Jeung et al. | |
| 2019/0051797 A1* | 2/2019 | Sung | H01L 33/12 |
| 2019/0164945 A1* | 5/2019 | Chae | H01L 33/50 |
| 2019/0165038 A1* | 5/2019 | Chae | H01L 33/504 |
| 2019/0165207 A1* | 5/2019 | Kim | H01L 25/0756 |
| 2019/0189596 A1* | 6/2019 | Chae | H01L 25/0753 |
| 2019/0214373 A1* | 7/2019 | Kim | H01L 33/42 |
| 2019/0252856 A1* | 8/2019 | Hirose | H01S 5/187 |
| 2019/0280158 A1* | 9/2019 | Sung | H01L 33/14 |
| 2019/0355884 A1 | 11/2019 | Pan et al. | |
| 2019/0386180 A1* | 12/2019 | Hwang | H01L 33/46 |
| 2020/0153197 A1* | 5/2020 | Chen | H01S 5/04254 |
| 2020/0161499 A1* | 5/2020 | Ota | H01L 33/10 |
| 2020/0212262 A1* | 7/2020 | Jang | H01L 27/15 |
| 2020/0212263 A1* | 7/2020 | Heo | H01L 33/405 |
| 2020/0212267 A1* | 7/2020 | Kwak | H01L 33/504 |
| 2020/0235267 A1* | 7/2020 | Cho | H01L 33/50 |
| 2020/0365647 A1* | 11/2020 | Jang | H01L 33/38 |
| 2020/0365649 A1* | 11/2020 | Jang | H01L 33/44 |

* cited by examiner

LIGHT EMITTING DEVICE

BACKGROUND

Field of Invention

The present disclosure relates to a light emitting device.

Description of Related Art

In recent years, with the merits of high-directivity, energy saving, etc., light emitting diodes (LEDs) have been applied in various illumination devices and display devices. Micro-sized LEDs (Micro-LEDs) array, which is arranged in matrix format to be individually addressed for applications such as micro-size display, may be used to enhance the light output compared with the standard broad area LED.

A conventional LED device may have an n-doped layer and a p-doped layer separated by a multi-quantum well (MQW) layer. Voltage may be applied between the n-doped layer and the p-doped layer via electrodes. Interfaces between the electrodes and the n-doped layer and p-doped layers are expected to be an Ohmic contact to reduce contact resistance. The LED device mainly has an Ohmic contact layer therebetween to lower the contact resistance. For efficient light extraction, the Ohmic contact layer is designed to have reduced area to minimize absorption thereby. However, it is difficult to manufacture the Ohmic contact layer with reduced area when it comes to Micro-LEDs.

SUMMARY

The embodiments of the present disclosure provide a light emitting device. The light emitting device includes a semiconductor reflector between the light emitting layer and the n-type contact layer so as to prevent the n-type contact layer from absorbing light which is generated in the light emitting layer, thereby enhancing the light emission efficiency of the light emitting device. The light emitting device further includes a first insulating layer having a refractive index different from a refractive index of the p-type semiconductor layer. Therefore, enhanced light emission efficiency can be provided for the light emitting device.

One advantage is that enhanced light emission efficiency can be provided for the light emitting device because the semiconductor reflector can prevent the n-type contact layer from absorbing light which is generated in the light emitting layer. Another advantage is that enhanced light emission efficiency can be provide for the light emitting device because the refractive index of the first insulating layer is less than the refractive index of the p-type semiconductor layer. Yet another advantage is that improved light extraction efficiency can be provided for the light emitting device because of reducing loss due to total internal reflection between air and the top surface of the p-type semiconductor layer.

In some embodiments, a light emitting device includes a stacked structure and a first insulating layer covering at least side surfaces of the stacked structure. The stacked structure includes a p-type semiconductor layer, an n-type semiconductor layer on the p-type semiconductor layer, a light emitting layer sandwiched between the p-type semiconductor layer and the n-type semiconductor layer, an n-type electrode on the n-type semiconductor layer, an n-type contact layer sandwiched between the n-type semiconductor layer and the n-type electrode, a p-type electrode on the p-type semiconductor layer, an n-type contact pad on the n-type electrode, a p-type contact pad on the p-type electrode, and a semiconductor reflector between the light emitting layer and the n-type contact layer. The semiconductor reflector includes multiple periods. Each period includes at least a first layer and at least a second layer having a refractive index different from a refractive index of the first layer.

In some embodiments, the p-type semiconductor layer has a top surface facing away from the semiconductor reflector and the top surface is a rough surface.

In some embodiments, the first insulating layer has a refractive index less than a refractive index of the p-type semiconductor layer.

In some embodiments, the first insulating layer extends to a top surface of the p-type semiconductor layer.

In some embodiments, the first insulating layer covers a bottom surface of the stacked structure and exposes a bottom part of the n-type contact pad and a bottom part of the p-type contact pad.

In some embodiments, the n-type semiconductor layer has a first portion and a second portion spaced apart from the first portion by the semiconductor reflector.

In some embodiments, the first insulating layer extends to cover the rough surface.

In some embodiments, a top surface of the first insulating layer facing away from the p-type semiconductor layer has a similar shape with that of the rough surface.

In some embodiments, the first layer and the second layer of the semiconductor reflector include aluminum, and an atomic percentage of the aluminum in the first layer is substantially different from an atomic percentage of the aluminum in the second layer.

In some embodiments, the first layer of the semiconductor reflector includes $Al_xGa_{1-x}As$, wherein $0<x<1$.

In some embodiments, the second layer of the semiconductor reflector includes $Al_yGa_{1-y}As$, wherein $0<y<1$.

In some embodiments, the light emitting device further includes a second insulating layer covering the first insulating layer. The second insulating layer has a refractive index different from a refractive index of the first insulating layer.

In some embodiments, the refractive index of the second insulating layer is less than the refractive index of the first insulating layer.

In some embodiments, a top surface of the second insulating layer facing away from the p-type semiconductor layer has a similar shape with that of the top surface of the first insulating layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
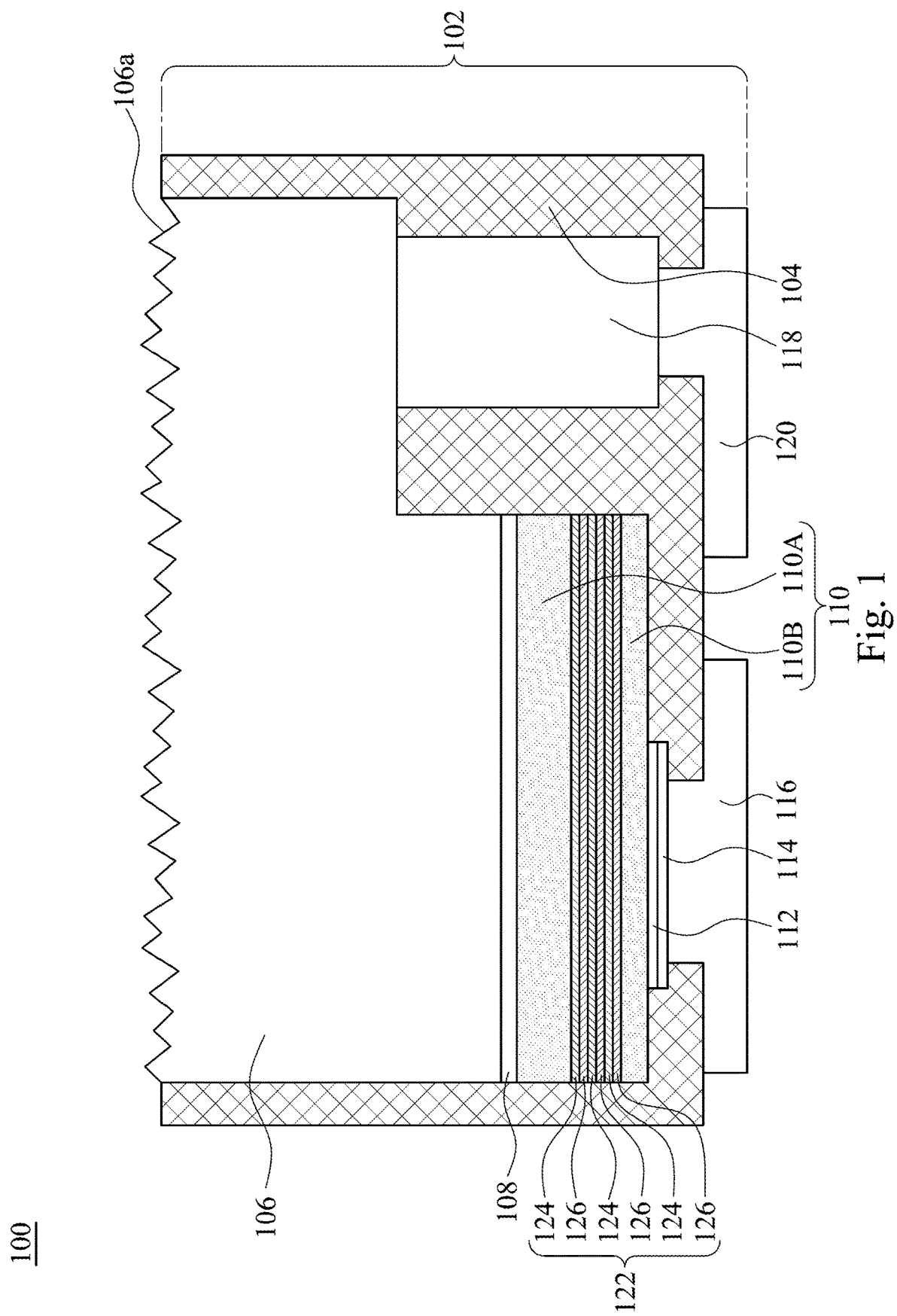
FIGS. 1-4 are cross-sectional views of a light emitting device according to some embodiments.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a light emitting device 100 according to some embodiments. Reference is made to FIG. 1. The light emitting device 100 has a stacked structure 102 and a first insulating layer 104 covering at least side surfaces of the stacked structure 102. The stacked structure 102 includes a p-type semiconductor layer 106, an n-type semiconductor layer 110, and a light emitting layer 108. The n-type semiconductor layer 110 is on the p-type semiconductor layer 106. The light emitting layer 108 is sandwiched between the p-type semiconductor layer 106 and the n-type semiconductor layer 110. In some embodiments, the p-type semiconductor layer 106 is a p-type GaP layer, and the n-type semiconductor layer 110 is an n-type AlGaInP layer.

The stacked structure 102 further includes an n-type electrode 114, an n-type contact layer 112, a p-type electrode 118, an n-type contact pad 116, and a p-type contact pad 120. The n-type electrode 114 is on the n-type semiconductor layer 110. The n-type contact layer 112 is sandwiched between the n-type semiconductor layer 110 and the n-type electrode 114. The n-type contact pad 116 is on the n-type electrode 114. The p-type electrode 118 is on the p-type semiconductor layer 106. The p-type contact pad 120 is on the p-type electrode 118. In some embodiments, the n-type contact layer 112 is an n-type GaAs layer.

In some embodiments, the light emitting layer 108 is a multiple quantum well active layer. In an embodiment, the multiple quantum well active layer is formed of alternating layers of a well layer and a barrier layer. In some embodiments, the light emitting layer 108 emits red light and the light emitting device 100 is a red light emitting device.

The stacked structure 102 further includes a semiconductor reflector 122 between the light emitting layer 108 and the n-type contact layer 112. In some embodiments, the n-type semiconductor layer 110 has a first portion 110A and a second portion 110B spaced apart from the first portion 110A by the semiconductor reflector 122. The second portion 110B of the n-type semiconductor layer 110 is closer to the n-type contact layer 112 than the first portion 110A of the n-type semiconductor layer 110. A normal projection of the light emitting layer 108 onto the second portion 110B of the n-type semiconductor layer 110 overlaps a normal projection of the semiconductor reflector 122 onto the second portion 110B of the n-type semiconductor layer 110. The semiconductor reflector 122 can reflect light which is generated in the light emitting layer 108. In particular, the semiconductor reflector 122 can prevent the n-type contact layer 112 from absorbing light which is generated in the light emitting layer 108, thereby enhancing the light emission efficiency of the light emitting device 100. In other words, the semiconductor reflector 122 can redirect the light from passing downwards (i.e., in a direction toward the n-type contact layer 112) to passing upwards (in a direction toward the p-type semiconductor layer 106).

In some embodiments, the semiconductor reflector 122 is a distributed Bragg reflector (DBR). The semiconductor reflector 122 includes multiple periods. Each period includes at least a first layer 124 and at least a second layer 126. A refractive index of the first layer 124 is different from a refractive index of the second layer 126. The first layer 124 and the second layer 126 of the semiconductor reflector 122 include aluminum in some embodiments. The refractive index of the first layer 124 and the refractive index of the second layer 126 depend on the atomic percentage of the aluminum therein. For example, the first layer 124 of the semiconductor reflector 122 includes $Al_xGa_{1-x}As$, in which $0<x<1$. The second layer 126 of the semiconductor reflector 122 includes $Al_yGa_{1-y}As$, in which $0<y<1$ and y is different from x. That is to say, an atomic percentage of the aluminum in the first layer 124 is substantially different from an atomic percentage of the aluminum in the second layer 126.

In some embodiments, the first insulating layer 104 covers a bottom surface of the stacked structure 102 and exposes a bottom part of the n-type contact pad 116 and a bottom part of the p-type contact pad 120. The first insulating layer 104 has a refractive index less than a refractive index of the p-type semiconductor layer 106 such that light extraction efficiency can be improved by the first insulating layer.

The p-type semiconductor layer 106 has a top surface 106a facing away from the semiconductor reflector 122. The top surface 106a of the p-type semiconductor layer 106 has irregularities. In other words, the top surface 106a of the p-type semiconductor layer 106 is a rough surface, thereby improving the light extraction efficiency of the light emitting device 100 by reducing loss due to total internal reflection (TIR) between air and the top surface 106a of the p-type semiconductor layer 106.

Figure 2:
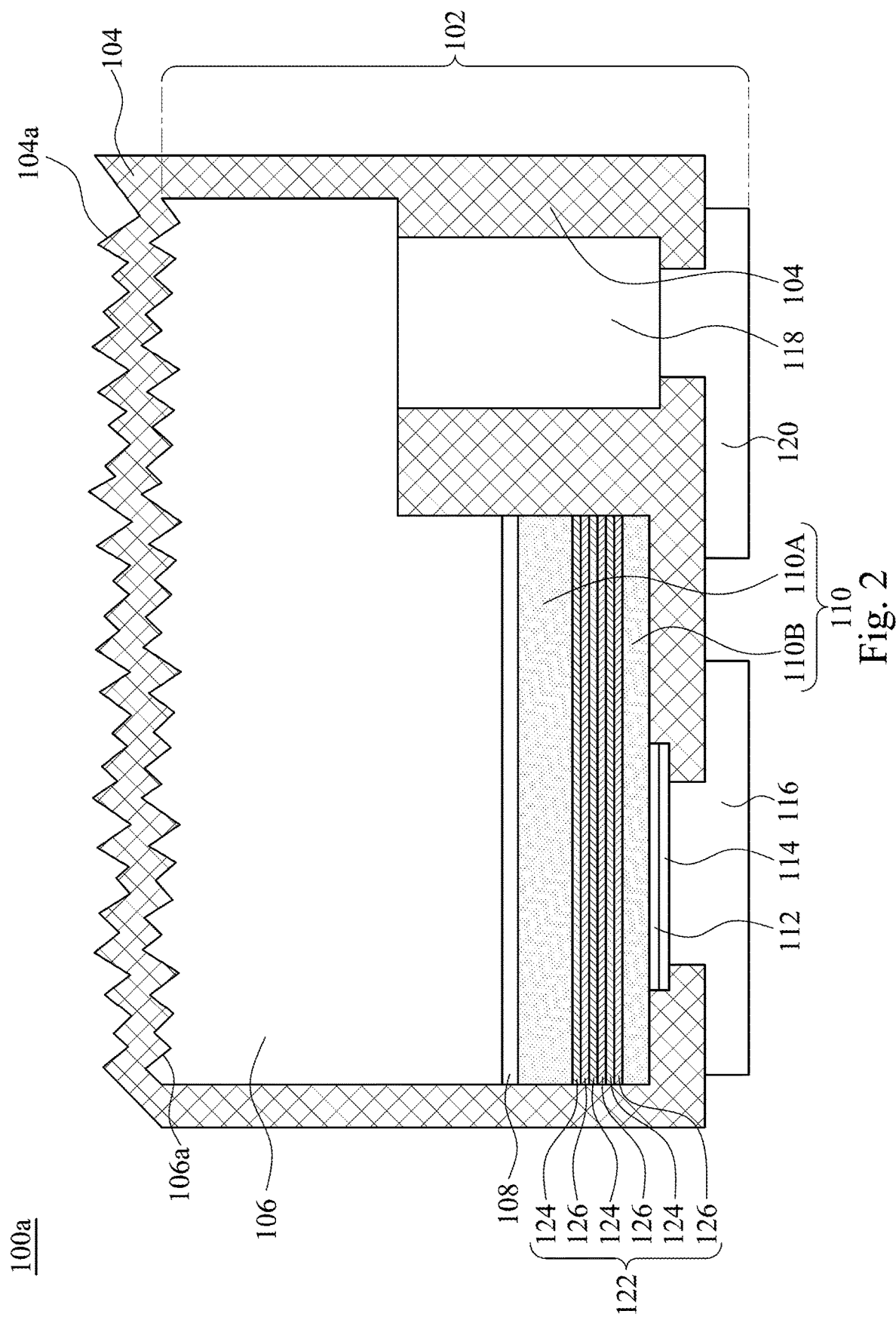

FIG. 2 is a cross-sectional view of a light emitting device 100a in accordance with another embodiment. As shown in FIG. 2, the main difference between the light emitting device 100a and the light emitting device 100 is that the first insulating layer 104 of the light emitting device 100a extends to cover the top surface 106a of the p-type semiconductor layer 106. In some embodiments, a top surface 104a of the first insulating layer 104 facing away from the p-type semiconductor layer 106 has a similar shape with that of the top surface 106a of the p-type semiconductor layer 106. In other words, the top surface 106a of the p-type semiconductor layer 106 and the top surface 104a of the first insulating layer 104 have irregularities. That is to say, the top surface 106a of the p-type semiconductor layer 106 and the top surface 104a of the first insulating layer 104 are rough surfaces, thereby improving the light extraction efficiency of the light emitting device 100a by reducing loss due to total internal reflection between air and the top surface 104a of the first insulating layer 104.

Figure 3:
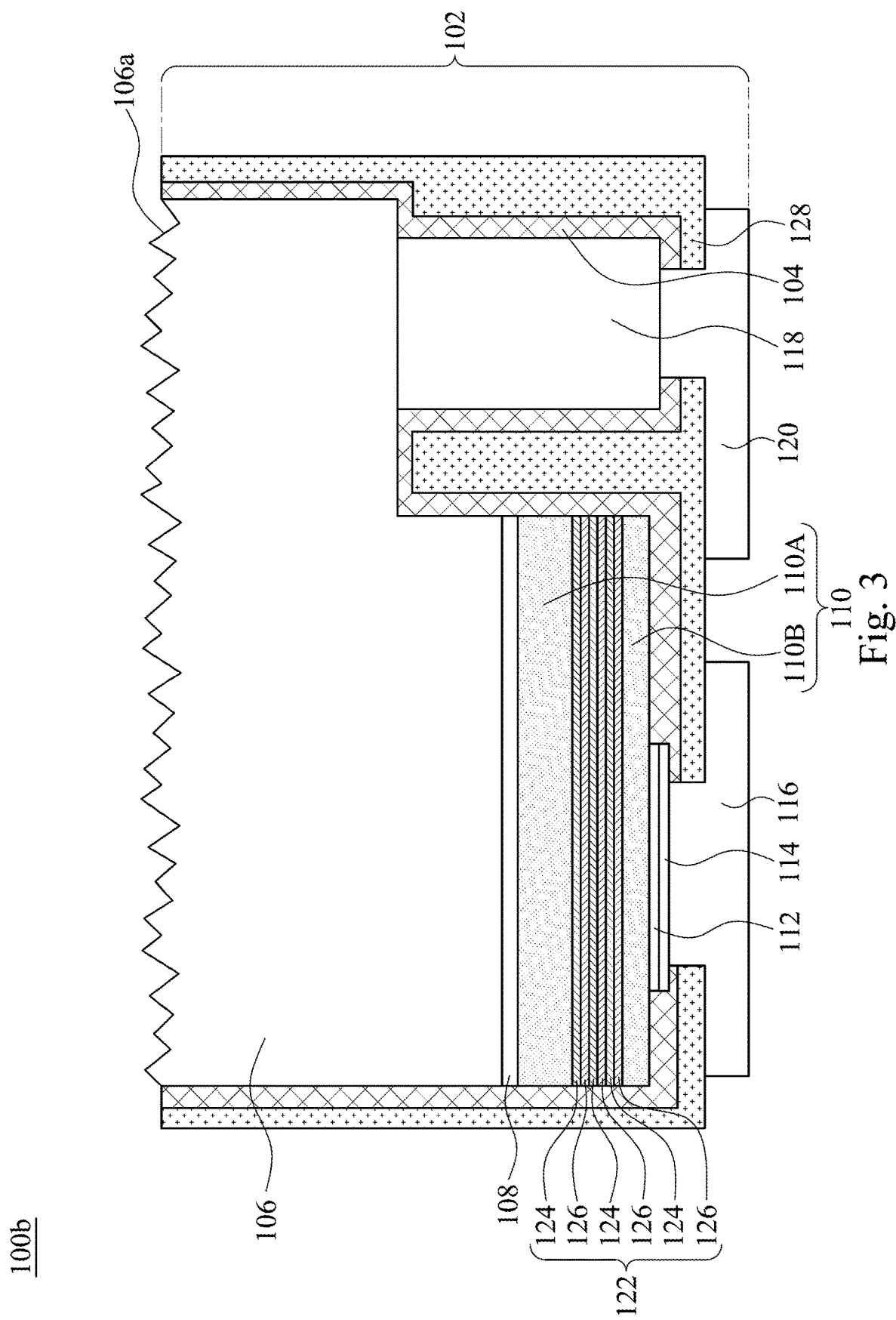

FIG. 3 is a cross-sectional view of a light emitting device 100b in accordance with another embodiment. As shown in FIG. 3, the main difference between the light emitting device 100b and the light emitting device 100 is that the light emitting device 100b further includes a second insulating layer 128 covering the first insulating layer. In other words, the first insulating layer 104 is between the stacked structure 102 and the second insulating layer 128. The second insulating layer 128 has a refractive index different from the refractive index of the first insulating layer 104. In some embodiments, the refractive index of the second insulating layer 128 is less than the refractive index of the first insulating layer 104. Therefore, light extraction efficiency of the light emitting device 100b can be improved.

Figure 4:
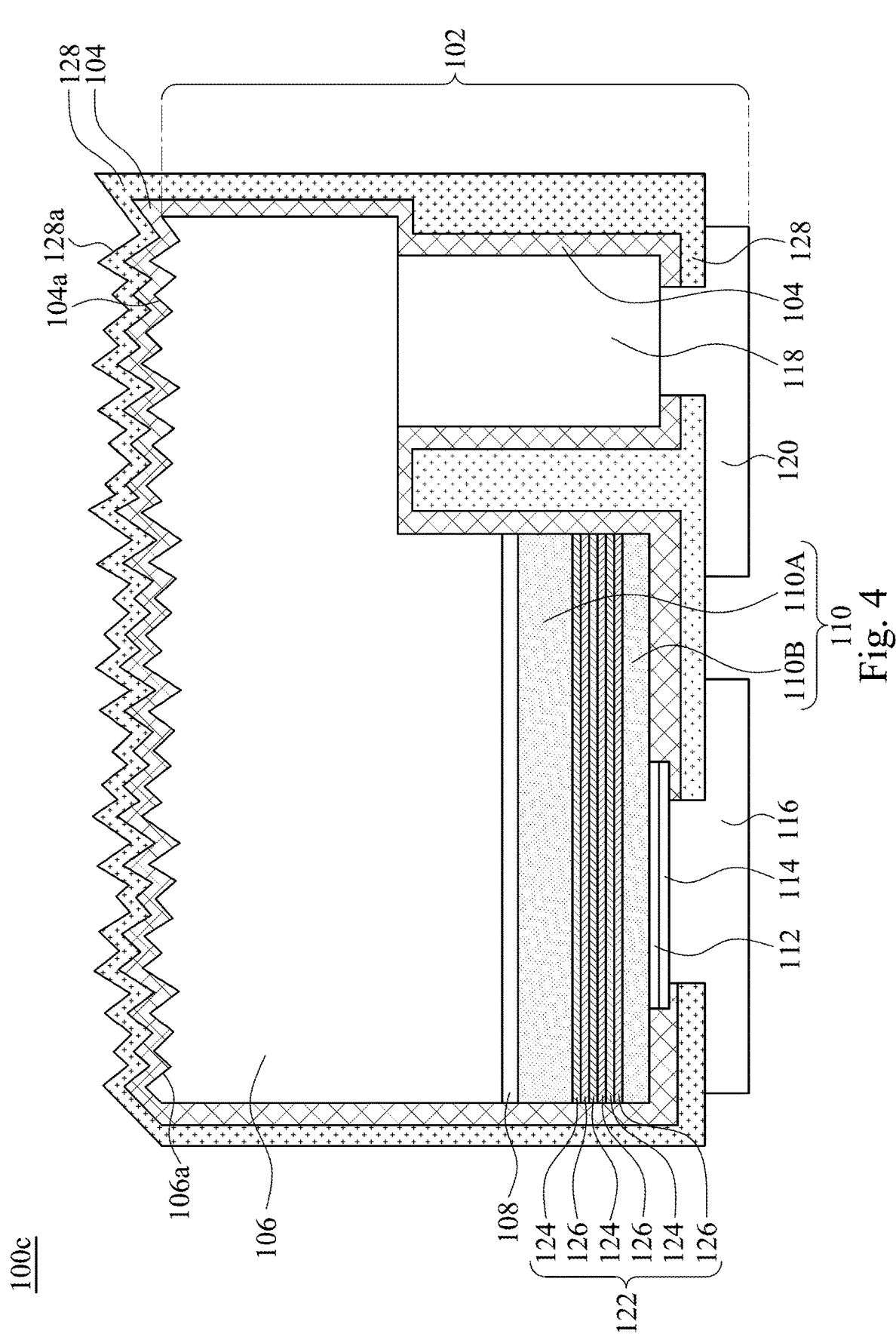

FIG. 4 is a cross-sectional view of a light emitting device 100c in accordance with another embodiment. As shown in FIG. 4, the main difference between the light emitting device 100c and the light emitting device 100b is that the first insulating layer 104 and the second insulating layer 128 extend to the top surface 106a of the p-type semiconductor layer 106. The second insulating layer 128 covers the first insulating layer 104. In particular, the first insulating layer 104 is partially between the top surface 106a of the p-type semiconductor layer 106 and the second insulating layer 128. A top surface 128a of the second insulating layer 128 facing away from the p-type semiconductor layer 106 has a similar shape with that of the top surface 104a of the first insulating layer 104. In some embodiments, the top surface 128a of the second insulating layer 128 is a rough surface, and the top surface 104a of the first insulating layer 104 is a rough surface as mentioned before with regard to FIG. 1. The top surface 128a of the second insulating layer 128 has irregularities, thereby improving the light extraction efficiency of the light emitting device 100c by reducing loss due to total internal reflection between air and the top surface 128a of the second insulating layer 128.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that enhanced light emission efficiency can be provided for the light emitting device because the semiconductor reflector can prevent the n-type contact layer from absorbing light which is generated in the light emitting layer. Another advantage is that enhanced light emission efficiency can be provide for the light emitting device because the refractive index of the first insulating layer is less than the refractive index of the p-type semiconductor layer. Yet another advantage is that improved light extraction efficiency can be provided for the light emitting device because of reducing loss due to total internal reflection between air and the top surface of the p-type semiconductor layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting device, comprising:
a stacked structure comprising:
a p-type semiconductor layer;
an n-type semiconductor layer on the p-type semiconductor layer;
a light emitting layer sandwiched between the p-type semiconductor layer and the n-type semiconductor layer;
an n-type electrode on the n-type semiconductor layer;
an n-type contact layer sandwiched between the n-type semiconductor layer and the n-type electrode;
a p-type electrode on the p-type semiconductor layer;
an n-type contact pad on the n-type electrode;
a p-type contact pad on the p-type electrode; and
a semiconductor reflector between the light emitting layer and the n-type contact layer, the semiconductor reflector including multiple periods, each period comprising at least a first layer and at least a second layer, a refractive index of the first layer being different from a refractive index of the second layer; and
a first insulating layer covering at least side surfaces of the stacked structure.

2. The light emitting device of claim 1, wherein the p-type semiconductor layer has a top surface facing away from the semiconductor reflector and the top surface is a rough surface.

3. The light emitting device of claim 1, wherein the first insulating layer has a refractive index less than a refractive index of the p-type semiconductor layer.

4. The light emitting device of claim 1, wherein the first insulating layer extends to a top surface of the p-type semiconductor layer.

5. The light emitting device of claim 1, wherein the first insulating layer covers a bottom surface of the stacked structure and exposes a bottom part of the n-type contact pad and a bottom part of the p-type contact pad.

6. The light emitting device of claim 1, wherein the n-type semiconductor layer has a first portion and a second portion spaced apart from the first portion by the semiconductor reflector.

7. The light emitting device of claim 2, wherein the first insulating layer extends to cover the rough surface.

8. The light emitting device of claim 7, wherein a top surface of the first insulating layer facing away from the p-type semiconductor layer has a similar shape with that of the rough surface.

9. The light emitting device of claim 1, wherein the first layer and the second layer of the semiconductor reflector include aluminum, and an atomic percentage of the aluminum in the first layer is substantially different from an atomic percentage of the aluminum in the second layer.

10. The light emitting device of claim 1, wherein the first layer of the semiconductor reflector includes $Al_xGa_{1-x}As$, wherein $0<x<1$.

11. The light emitting device of claim 1, wherein the second layer of the semiconductor reflector includes $Al_yGa_{1-y}As$, wherein $0<y<1$.

12. The light emitting device of claim 1, further comprising a second insulating layer covering the first insulating layer, wherein the second insulating layer has a refractive index different from a refractive index of the first insulating layer.

13. The light emitting device of claim 12, wherein the refractive index of the second insulating layer is less than the refractive index of the first insulating layer.

14. The light emitting device of claim 4, further comprising a second insulating layer covering the first insulating layer, wherein the second insulating layer has a refractive index different from a refractive index of the first insulating layer.

15. The light emitting device of claim 14, wherein the refractive index of the second insulating layer is less than the refractive index of the first insulating layer.

16. The light emitting device of claim 7, further comprising a second insulating layer covering the first insulating layer, wherein a refractive index of the second insulating layer is different from a refractive index of the first insulating layer.

17. The light emitting device of claim 16, wherein the refractive index of the second insulating layer is less than the refractive index of the first insulating layer.

18. The light emitting device of claim 8, further comprising a second insulating layer covering the first insulating layer, wherein a refractive index of the second insulating layer is different from a refractive index of the first insulating layer.

19. The light emitting device of claim 18, wherein the refractive index of the second insulating layer is less than the refractive index of the first insulating layer.

20. The light emitting device of claim 18, wherein a top surface of the second insulating layer facing away from the p-type semiconductor layer has a similar shape with that of the top surface of the first insulating layer.

* * * * *